(12) United States Patent
So et al.

(10) Patent No.: US 6,646,308 B2
(45) Date of Patent: Nov. 11, 2003

(54) FLAT PANEL DISPLAY DEVICE

(75) Inventors: Woo-Young So, Suwon (KR);
Kyung-Jin Yoo, Suwon (KR); Sang-Il Park, Seoul (KR)

(73) Assignee: Samsung SDI Co., Ltd., Suwon (KR)

(*) Notice: Subject to any disclaimer, the term of this patent is extended or adjusted under 35 U.S.C. 154(b) by 0 days.

(21) Appl. No.: 10/120,425

(22) Filed: Apr. 12, 2002

(65) Prior Publication Data

US 2002/0149054 A1 Oct. 17, 2002

(30) Foreign Application Priority Data

Apr. 12, 2001 (KR) .................................... 2001-0019639

(51) Int. Cl.$^7$ ..................... H01L 27/01; H01L 27/12; H01L 31/0392
(52) U.S. Cl. ................. 257/347; 257/348; 257/349; 257/350
(58) Field of Search ............................. 257/59, 72, 88, 257/347–354, 507; 438/149, 151, 479, 517

(56) References Cited

U.S. PATENT DOCUMENTS 6,100,954 A * 8/2000 Kim et al. .................. 349/138

* cited by examiner

*Primary Examiner*—Thien Tran
(74) *Attorney, Agent, or Firm*—McGuireWoods LLP

(57) ABSTRACT

A flat panel display device with improved electrical characteristics and a simplified manufacturing process is disclosed. The device includes a semiconductor layer formed on an insulating substrate; source and drain electrodes directly contacting both end portions of the semiconductor layer, respectively; a pixel electrode having an opening portion formed thereon; a first insulating layer formed over the remaining portion of the insulating substrate except for the opening portion; a gate electrode formed on a portion of the first insulating layer over the semiconductor layer; and source and drain regions formed in both end portions of the semiconductor layer.

9 Claims, 8 Drawing Sheets

FLAT PANEL DISPLAY DEVICE

BACKGROUND OF THE INVENTION

1. Field of the Invention

The present invention relates to a flat panel display device and a method of a manufacturing the same, and, more particularly, to a flat panel display device with improved electrical characteristics and reduced current leakage.

2. Description of Related Art

FIG. 1 is a cross-sectional view illustrating a conventional organic EL display device. A method of manufacturing the conventional organic EL display device is described below with reference to FIG. 1.

A buffer layer 12 is formed on a transparent substrate 11. The transparent substrate 11 is made of a glass or a synthetic resin. A poly silicon layer is deposited on the buffer layer 12 and patterned into a semiconductor layer 20 using a first mask. A first insulating layer 25 is formed over the entire surface of the transparent substrate 11.

Then, a first metal layer is deposited on the first insulating layer 25 and patterned into a gate electrode 35 using a second mask. Using the gate electrode 35 as a mask, an n-type impurity or a p-type impurity is ion-implanted into the semiconductor layer 20 to form source and drain regions 26 and 27.

Thereafter, a second insulating layer 30 is formed over the entire surface of the transparent substrate 11. The second insulating layer 30 serves as an interlayer insulating layer. Using a third mask, contact holes 31 and 32 are formed in the interlayer insulating layer 30. The contact holes 31 and 32 expose portions of the source and drain regions 26 and 27, respectively.

A second metal layer is deposited on the second insulating layer 30, filling into the contact holes 31 and 32. The second metal layer is patterned using a fourth mask to form source and drain electrodes 50 and 55. The source and drain electrodes 50 and 55 are electrically connected to the source and drain regions 26 and 27 through the contact holes 31 and 32, respectively.

Subsequently, a third insulating layer 40 is formed over the entire surface of the transparent substrate 11. Using a fifth mask, the third insulating layer 40 is etched to form a via hole 41 at a location corresponding to either of the source and drain electrodes 50 and 55. In FIG. 1, the via hole 41 is formed at a location corresponding to a portion of the drain electrode 55.

A transparent conductive material layer is deposited on the third insulating layer 40 and patterned using a sixth mask to form a pixel electrode 60. The pixel electrode 60 serves as an anode electrode. The pixel electrode 60 is electrically connected to either of the source and drain electrodes 50 and 55 through the via hole 41. In FIG. 1, the pixel electrode 40 is electrically connected to the drain electrode 55 through the via hole 41.

A fourth insulating layer 70 is formed over the entire surface of the transparent substrate 11. The fourth insulating layer 70 serves as a planarization layer. The fourth insulating layer 70 is etched using a seventh mask to form an opening portion 71. The opening portion 71 exposes a portion of the pixel electrode 60. An organic EL layer 80 is formed on the exposed portion of the pixel electrode 60 to cover the opening portion 71. Then, a cathode electrode 90 is formed to cover the organic EL layer 80. Therefore, the conventional organic EL display device is completed.

As described above, the method of manufacturing the conventional organic EL display device requires a seven-mask process. Therefore, this presents the difficulty that the manufacturing process is complicated and the production cost is increased.

Also, since the gate electrode 35 is used as a mask during an ion-implanting process to form the source and drain regions 26 and 27, the gate electrode 35 may become damaged during manufacturing, thereby deteriorating electrical characteristics of the flat panel display device.

In addition, when a lightly doped drain (LDD) structure or an offset structure is employed in order to improve an on/off current ratio, an additional mask process is required. In that case, a process to anodize the gate electrode can be employed so that an additional mask process is not required. However, this requires additional equipment for the anodizing process, thereby increasing the production cost.

SUMMARY OF THE INVENTION

To overcome the difficulties described above, preferred embodiments of the present invention provide a flat panel display device having a simplified manufacturing process.

It is another object of the present invention to provide a flat panel display device having excellent electrical characteristics.

It is a still object of the present invention to provide a flat panel display device which can reduce a leakage current.

In order to achieve the above objects, the preferred embodiments of the present invention provide a flat panel display device, comprising: a semiconductor layer formed on an insulating substrate; source and drain electrodes directly contacting both end portions of the semiconductor layer, respectively; a pixel electrode having an opening portion formed thereon; a first insulating layer formed over the remaining portion of the insulating substrate except for the opening portion; a gate electrode formed on a portion of the first insulating layer over the semiconductor layer; and source and drain regions formed in both end portions of the semiconductor layer.

The source and drain electrodes include a pixel electrode material layer, a metal material layer and a capping insulating material layer stacked sequentially. The pixel electrode extends from either of the source and drain electrodes. The organic EL display device further includes a storage capacitor including first and second capacitor electrodes with a dielectric layer interposed therebetween. The first capacitor electrode includes the pixel electrode material layer and the metal material layer stacked sequentially. The second capacitor electrode includes a gate electrode material layer. The dielectric layer includes the capping insulating layer and the first insulating layer stacked sequentially.

The source and drain regions include an offset region formed in a portion of the semiconductor layer between the source and drain electrodes and the gate electrode. The source and drain regions include low-density source and drain regions formed in a portion of the semiconductor layer between the source and drain electrodes and the gate electrode, thereby forming a lightly doped drain (LDD) structure.

The organic EL display device further includes first and second spacers. The first spacer is formed on side wall portions of the source and drain regions. The second spacer is formed on side wall portions of the gate electrode and the opening portion. The organic EL display device further includes a second insulating layer for planarization on the remaining portion of the first insulating layer except for the opening portion. The gate electrode includes a metal material layer and a capping insulating layer stacked sequentially.

The present invention further provides a method of manufacturing a flat panel display device, comprising: forming a semiconductor layer on an insulating layer; ion-implanting an impurity having a first conductivity into the semiconductor layer; forming source and drain electrodes, the source and drain electrodes directly contacting both end portions of the semiconductor layer; ion-implanting an impurity having a second conductivity into the semiconductor layer to form high-density source and drain regions and a channel area, the high-density source and drain regions directly contacting the source and drain electrodes; forming a first insulating layer over the entire surface of the insulating substrate; forming a pixel electrode having an opening portion formed thereon; and forming a gate electrode on a portion of the first insulating layer over the semiconductor layer.

The method further includes forming a contact hole contemporaneously with forming the pixel electrode having the opening portion, the contact hole contacting the first capacitor electrode and the gate electrode.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which.

DETAILED DESCRIPTION OF PREFERRED EMBODIMENTS

Reference will now be made in detail to preferred embodiments of the present invention, examples of which are illustrated in the accompanying drawings.

Figure 1:
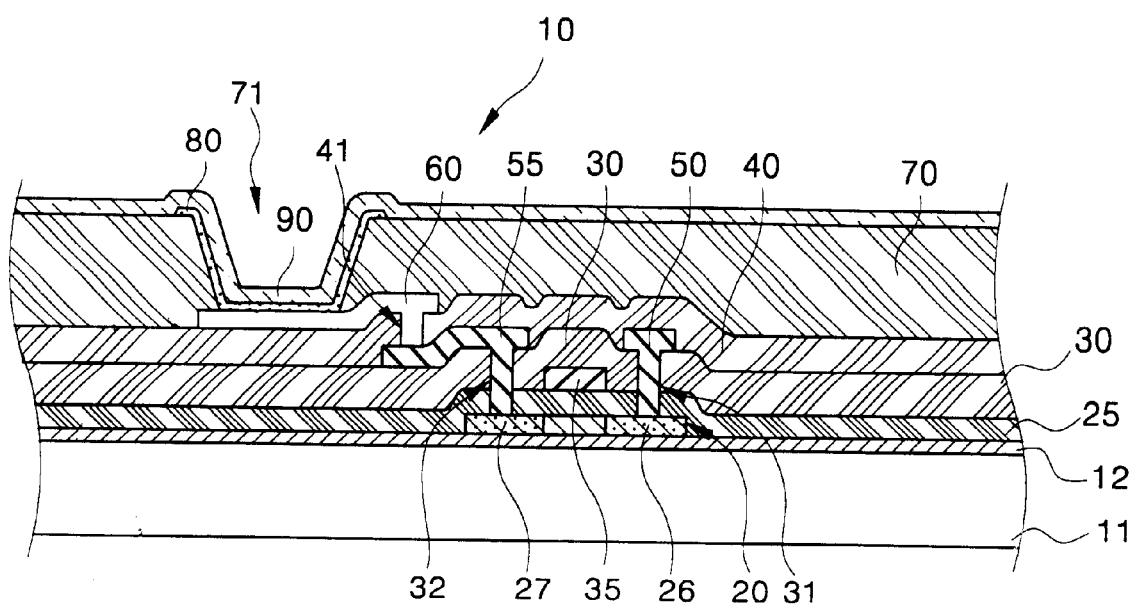
FIG. 1 is a cross-sectional view illustrating a conventional organic EL display device.
Figure 2:
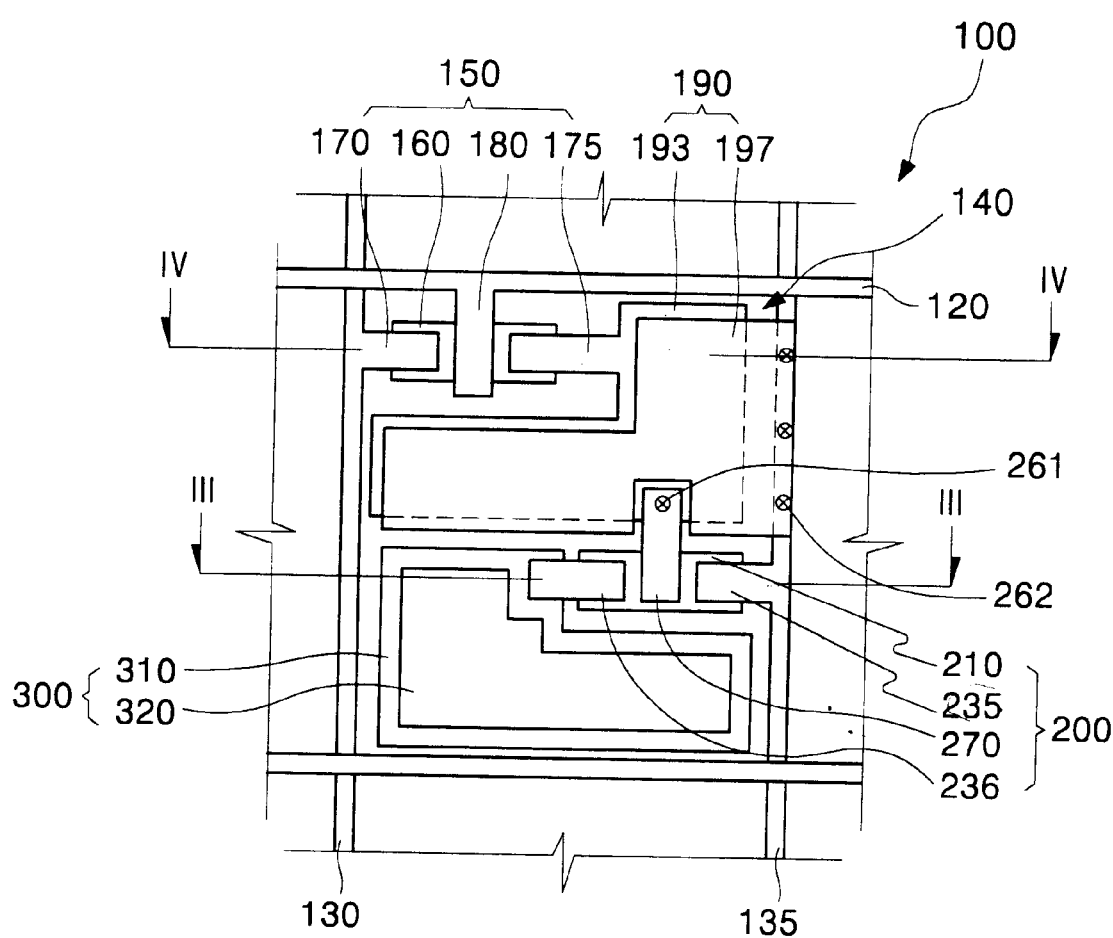
FIG. 2 is a plan view illustrating an embodiment of an organic EL display device according to the present invention.

FIG. 2 is a plan view illustrating an embodiment of an organic EL display device according to the present invention.

The organic EL display device 100 includes a plurality of pixels. Of the plurality of the pixels, FIG. 2 shows only one pixel. The pixel is formed at a pixel region 140 defined by a gate line 120, a data line 130, and a power supply line 135.

The gate line 120 is arranged in a transverse direction and applies an on/off signal of a thin film transistor (TFT). The data line 130 is arranged in a direction perpendicular to the gate line 120 and applies a data voltage. The power supply line 135 is spaced apart from the data line and is also arranged in a perpendicular to the gate line 120. Electrical power is applied to the power supply line 135 while the organic EL display device 100 is driven.

The pixel includes a first TFT 150, a storage capacitor 190, a second TFT 200, and an organic EL element 300.

The first TFT 150 includes a semiconductor layer 160, source and drain electrodes 170 and 175, respectively, and a gate electrode 180. The source and drain electrodes 170 and 175 contact both end portions of the semiconductor layer 160, respectively. The source electrode 170 extends from the data line 130, and the gate electrode 180 extends from the gate line 120.

The storage capacitor 190 includes first and second capacitor electrodes 193 and 197, respectively. The first capacitor electrode 193 is electrically connected to the drain electrode 175 of the first TFT 150. The second capacitor electrode 197 is electrically connected to the power supply line 135 through a contact hole 262.

The second TFT 200 includes a semiconductor layer 210, source and drain electrodes 235 and 236, respectively, and a gate electrode 270. The source and drain electrodes 235 and 236 contact both end portions of the semiconductor layer 210, respectively. The source electrode 235 extends from the power supply line 135, and the gate electrode 270 is electrically connected to the first capacitor electrode 193 through a contact hole 261.

The organic EL element 300 includes a pixel electrode 310 and an organic EL light-emitting layer 320. The pixel electrode 310 extends from either of the source and drain electrodes 235 and 236 of the second TFT 200. In FIG. 2, the pixel electrode 310 extends from the drain electrode 236 of the second TFT 200.

A method of manufacturing the organic EL display device according to the present invention is described below with reference to FIGS. 3A to 3H and to FIG. 4.

Figure 3A:
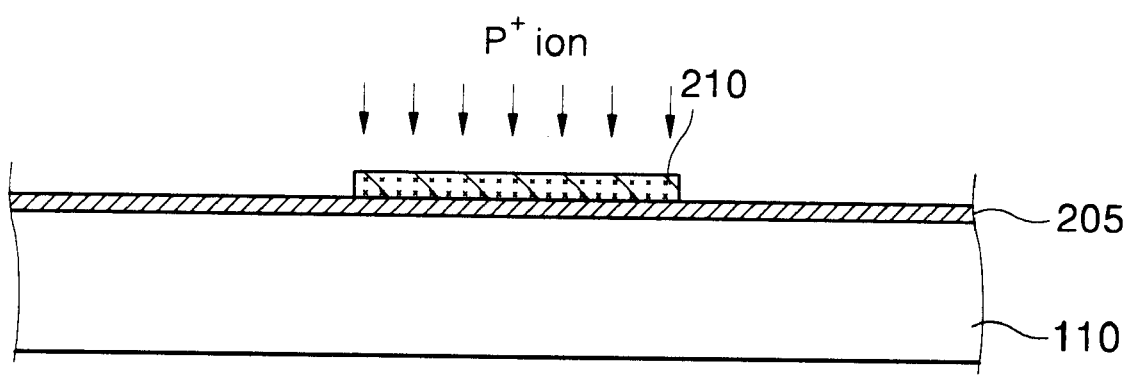
FIGS. 3A to 3H are cross-sectional views taken along line III—III of FIG. 2.
Figure 4:
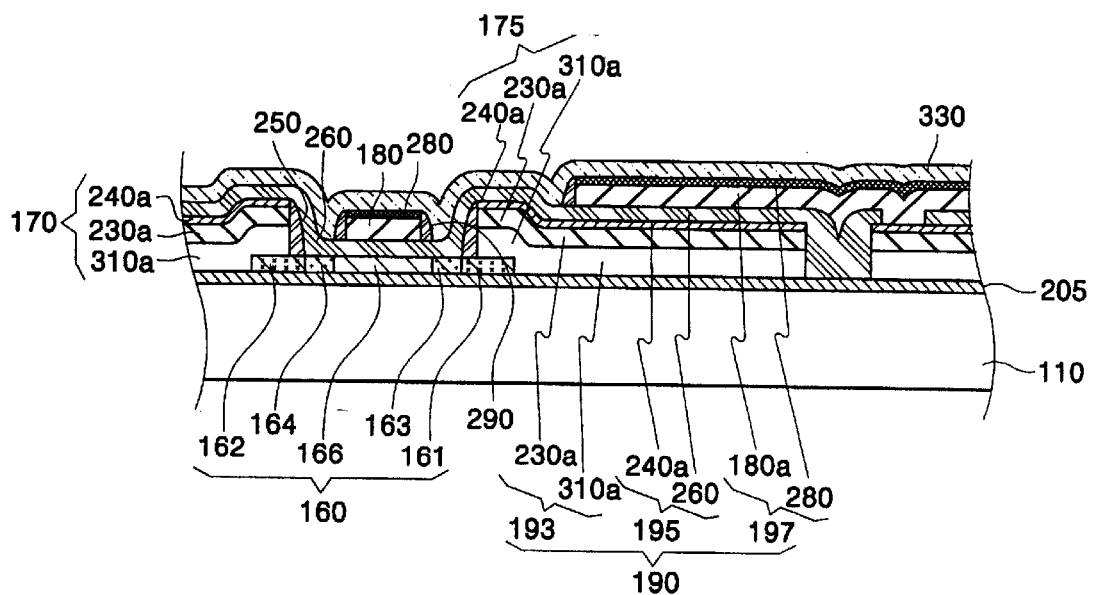
FIG. 4 is a cross-sectional view taken along line IV—IV of FIG. 2.

Referring now to FIGS. 3A and 4, a buffer layer 205 is formed on a transparent substrate 110. Preferably, the buffer layer 205 is made of SiO2. An amorphous silicon layer is deposited on the buffer layer 205. The amorphous silicon layer is crystallized by, for example, a laser annealing process to form a poly silicon layer. The poly silicon layer is patterned using a first mask (not shown) to form the semiconductor layer 160 of the first TFT 150 and the semiconductor layer 210 of the second TFT 200. The buffer layer 205 serves to shield the impurities such as an Na-ion from being diffused into the semiconductor layers 160 and 210. Thereafter, a first ion-implanting process is performed: a high-density impurity having a predetermined conductivity, e.g., a p+-type impurity, is ion-implanted into the entire surface of the semiconductor layers 160 and 210.

Figure 3B:
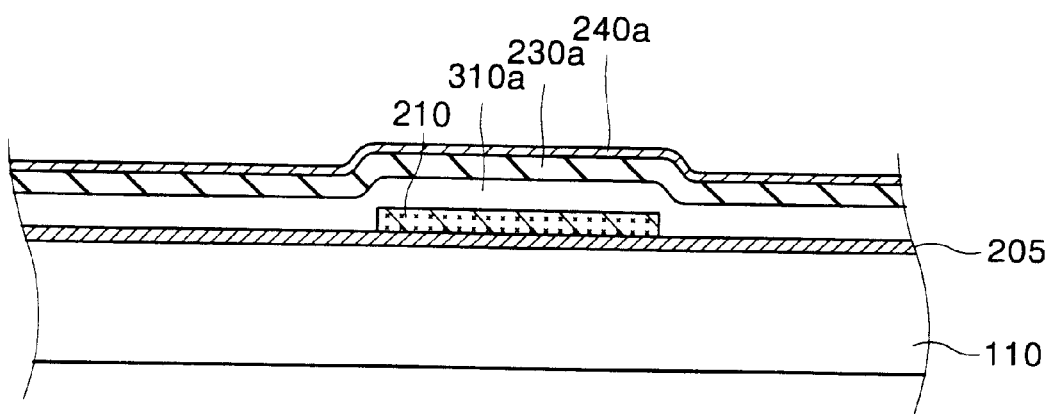

Referring now to FIGS. 3B and 4, a transparent conductive material layer 310a, a first metal layer 230a and a first insulating layer 240a are sequentially deposited over the entire surface of the transparent substrate 110.

Figure 3C:
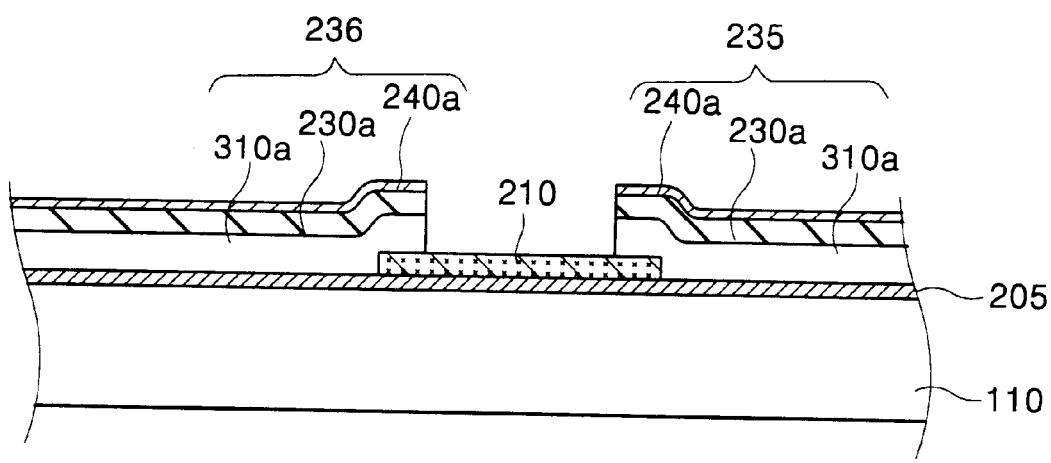

Referring now to FIGS. 3C and 4, the transparent conductive material layer 310a, the first metal layer 230a and the first insulating layer 240a are simultaneously patterned using a second mask (not shown) to expose respective central portions of the semiconductor layers 160 and 210, thereby forming the source and drain electrodes 170 and 175 of the first TFT 150, the source and drain electrodes 235 and 236 of the second TFT 200 and the first capacitor electrode 193.

The source and drain electrodes 170 and 175 of the first TFT 150 directly contact both end portions of the semiconductor layer 160, respectively, and have a multi-layered structure (i.e., three-layered structure).

The source and drain electrodes 235 and 236 of the second TFT 200 directly contact both end portions of the semiconductor layer 210, respectively, and have a multi-layered structure (i.e., three-layered structure).

The first capacitor electrode 193 has a dual-layered structure including the transparent conductive material layer 310a and the first metal layer 230a.

At the same time, the data line 130 and the power supply line 135 are formed and also have a dual-layered structure including the transparent conductive material layer 310a and the first metal layer 230a.

Preferably, the transparent conductive material layer 310a includes one of indium tin oxide (ITO) or indium zinc oxide (IZO).

Figure 3D:
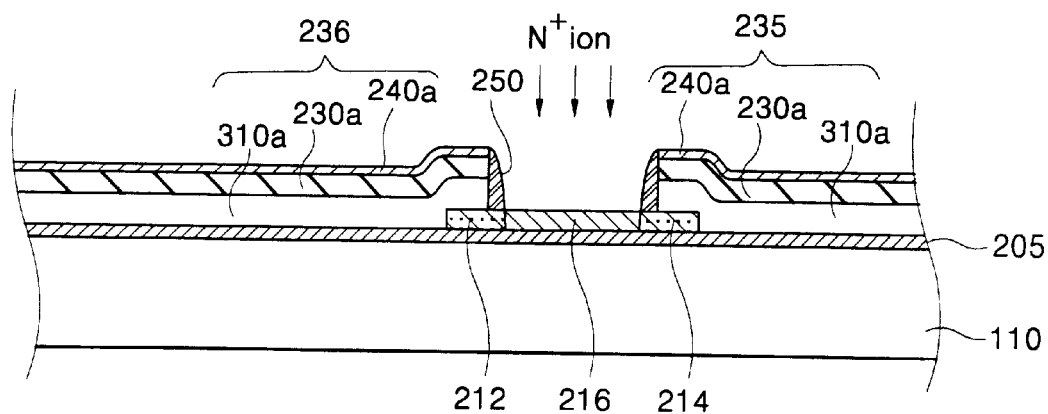

Subsequently, referring now to FIGS. 3D and 4, a second insulating layer is deposited over the entire surface of the transparent substrate 110 and is anisotropically etched to form a first spacer 250 on side wall portions of the source and drain electrodes 170 and 175 and on the side wall portion of the source and drain electrodes 235 and 236, respectively. Thereafter, a second ion-implanting process is performed: a high-density impurity having an opposite conductivity to that of the first ion-implanting process (i.e., n+-type impurity) is ion-implanted into the exposed portions of the semiconductor layers 160 and 210. As a result, the central portions of the semiconductor layers 160 and 210 enter a non-ion doped state and thus serve as a channel area. Also, both end portions of the semiconductor layers 160 and 210, under the source and drain electrodes 170, 175, 235, and 236 and the first spacer 250, serve as high-density source and drain regions 161, 162, 211, and 212.

The first spacer 250 is used to control an area size of the source and drain regions formed by the second ion-implanting process. Thus, the second ion-implanting process can be performed without a process of forming the spacer 250. This simplifies the manufacturing process.

During the second ion-implanting process, the first insulating layer 240a on the source and drain electrodes 170, 175, 235, and 236 serves as an ion-implanting barrier to prevent the source and drain electrodes 170, 175, 235, and 236 from being damaged by the impurity, thereby preventing defects of the source and drain electrodes 170, 175, 235, and 236 such as a hillock and a crack.

Figure 3E:
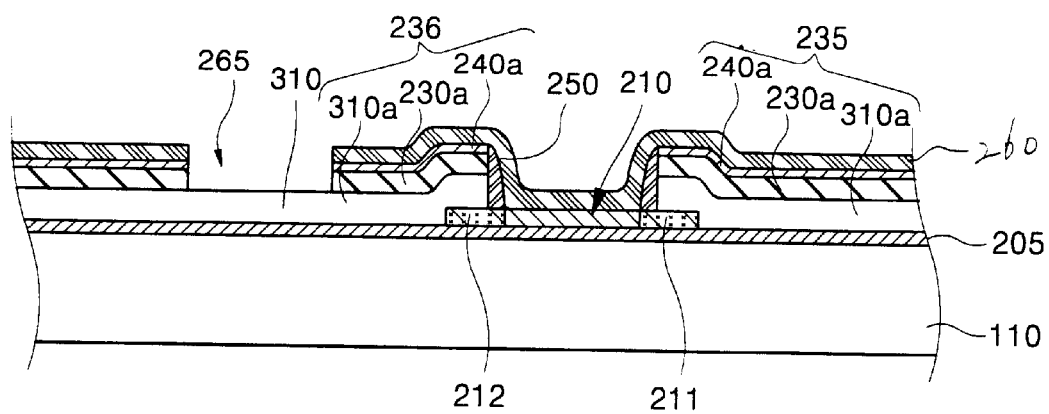

Next, referring now to FIGS. 3E and 4, a third insulating layer 260 is formed over the entire surface of the transparent substrate 110. A portion of the first insulating layer 240a and a portion of the third insulating layer 260 over the first capacitor electrode 193 serve as a dielectric layer 195. Thereafter, using a third mask (not shown), the first metal layer 230a, the first insulating layer 240a and the third insulating layer 260 are simultaneously etched to form an opening portion 265, thereby exposing a portion of the pixel electrode 310 extending from the drain electrode 236. At the same time, the first and second contact holes 261 and 262 are formed.

Figure 3F:
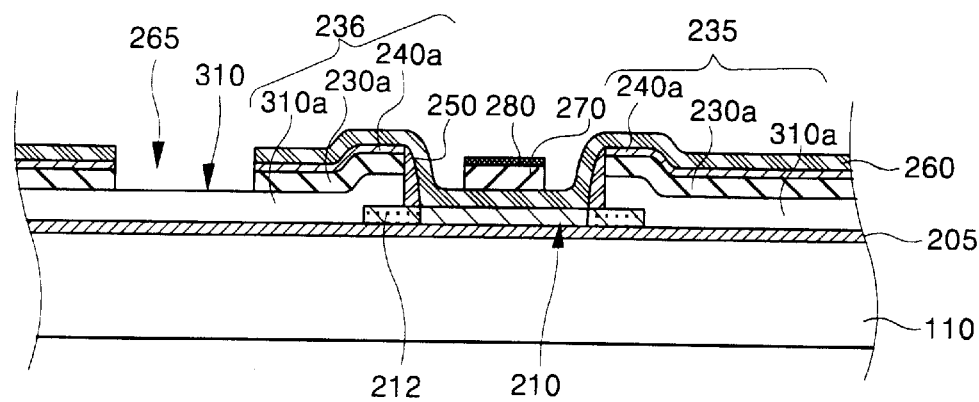

Referring now to FIGS. 3F and 4, a second metal layer and a fourth insulating layer are sequentially deposited on the third insulating layer 260 and patterned using a fourth mask to form the gate electrode 180 of the first TFT 150 and the gate electrode 270 of the second TFT 200. The gate electrodes 180 and 270 include a capping layer 280 formed thereon. At the same time, the second capacitor electrode 197 is formed. The second capacitor electrode 197 includes a metal layer 180a and the capping layer 280. The gate electrode 270 of the second TFT 200 is electrically connected to the first capacitor electrode 193 through the first contact hole 261, and the power supply line 135 is electrically connected to the second capacitor electrode 197 through the second contact hole 262.

Figure 3G:
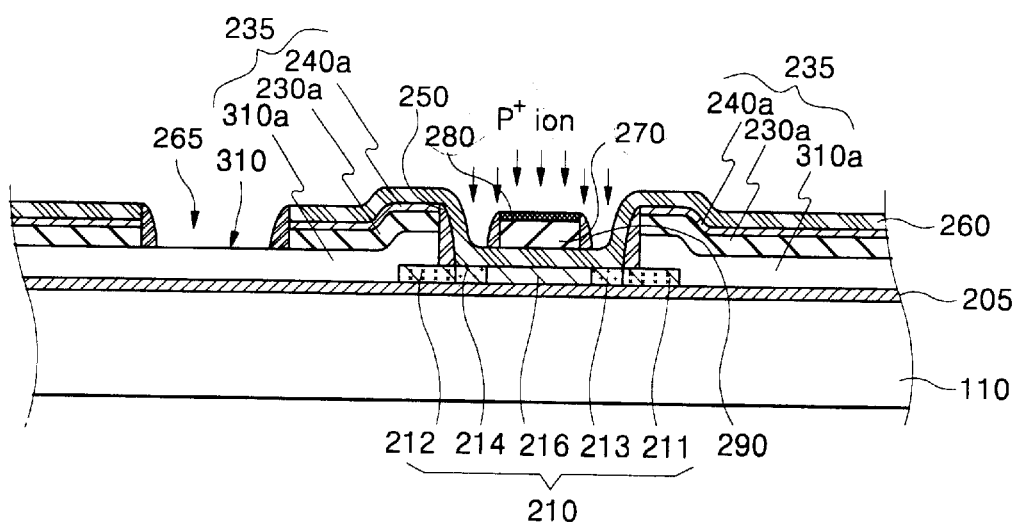

Referring now to FIGS. 3G and 4, a fifth insulating layer is deposited over the entire surface of the transparent substrate 110 and is anisotropically etched to form a second spacer 290 on both side wall portions of the gate electrodes 180 and 270. Thereafter, a third ion-implanting process is performed during which a low-density impurity, i.e., a p-type low-density impurity, is ion-implanted into the semiconductor layers 160 and 210 to form low-density source and drain regions 163, 164, 213, and 214, whereby a lightly doped drain (LDD) structure is formed.

At this time, when the third ion-implanting process is not performed, the regions 163, 164, 213, and 214 serve as an offset region, and thus an offset structure is formed.

The capping layer 280 serves as an ion-implanting barrier to prevent the gate electrodes 180 and 270 from being damaged by the impurity.

Figure 3H:
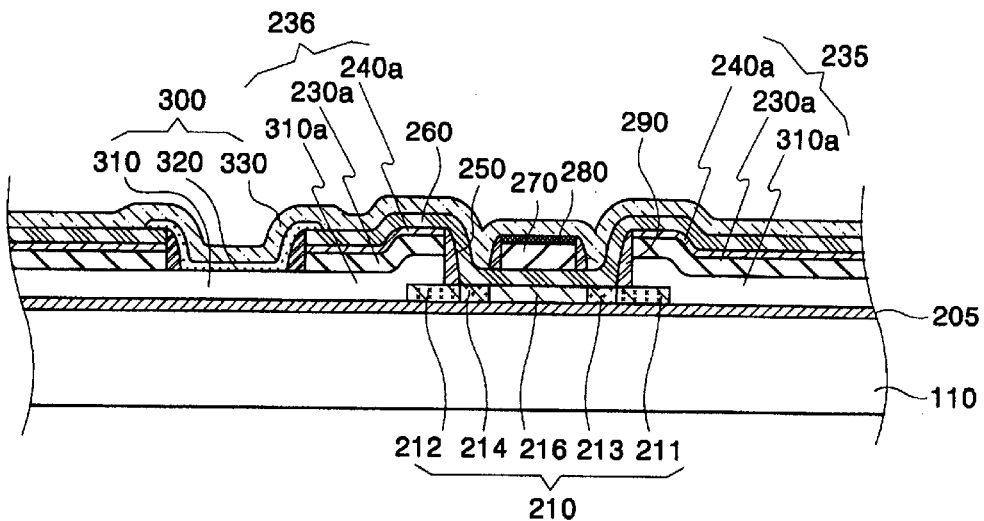

Referring now to FIGS. 3H and 4, the organic EL light-emitting layer 320 is formed on the exposed portion of the pixel electrode 310 to cover the opening portion 265. Then, a cathode electrode 330 is formed to cover the organic EL light-emitting layer 320. The cathode electrode 330 is made of a material having a work function lower than does the anode electrode 310.

As described above, the organic EL display device according to the present invention is seen to be manufactured through a process that requires only four masks.

Figure 5:
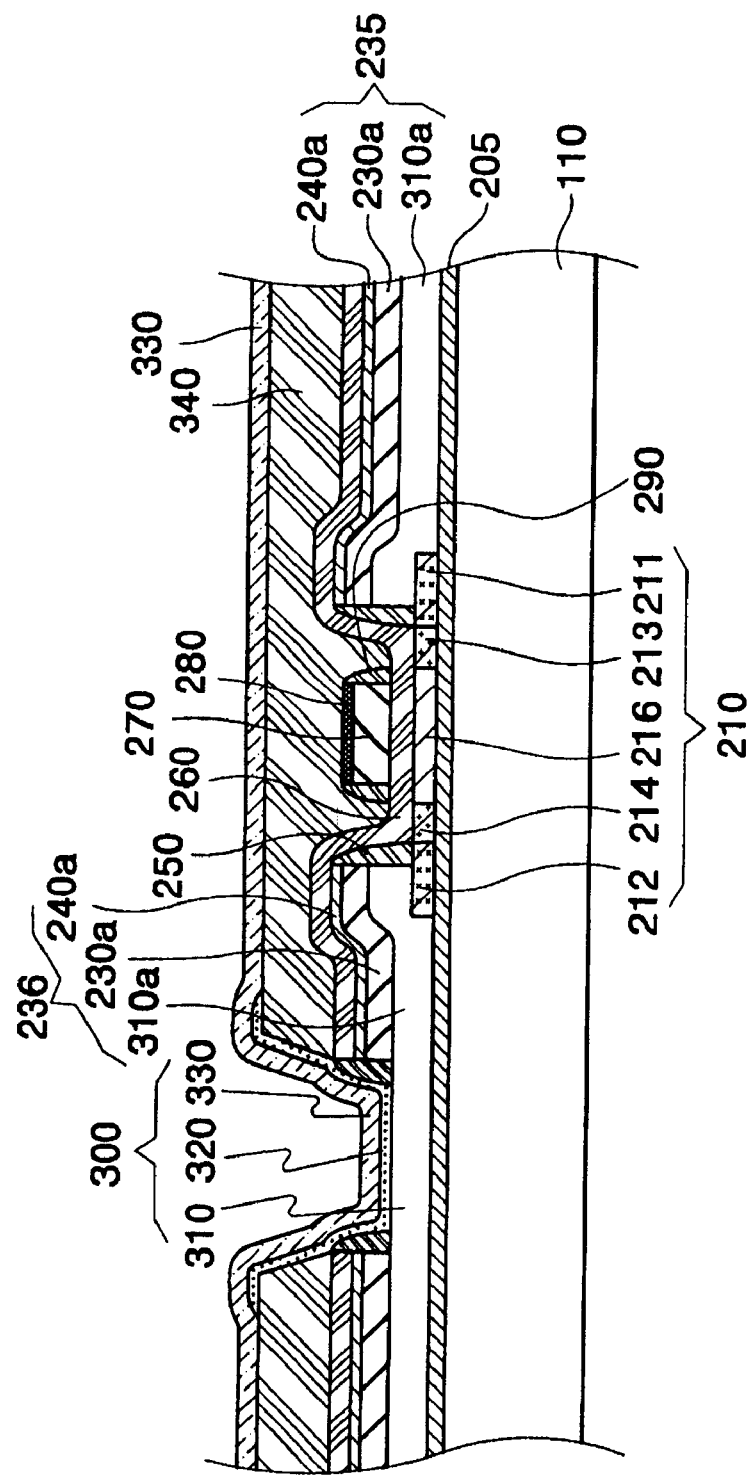
FIG. 5 is a cross-sectional view illustrating another embodiment of the organic EL display device according to the present invention.

FIG. 5 is a cross-sectional view illustrating another embodiment of the organic EL display device according to the present invention. The organic EL display device of FIG. 5 includes a planarization layer 340 that is formed after the second spacer 290 is formed during the process depicted in FIG. 3G. At this juncture, a process of forming the second spacer 290 can be omitted. Therefore, to manufacture the organic EL display device of FIG. 5 requires a five-mask process.

As described previously, conventional techniques require a seven-mask process. Therefore, since only a four-mask process or a five-mask process is used to manufacture the organic EL display device according to the present invention, the manufacturing process is simplified, thereby improving the manufacturing yield. Also, since the capping layers are formed on the source and drain electrodes and the gate electrodes in the present invention, it is possible to prevent the source and drain electrodes and the gate electrodes from being damaged by the impurity during the ion-implanting process. This provides improved electrical characteristics. In addition, since the organic EL display device can have an LDD structure or an offset structure, the leakage current can be reduced without an additional process.

The present invention is described focusing on the organic EL display device, but those skilled in the art will readily recognize that it can be applied to other flat panel display devices.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A flat panel display device, comprising:
   a semiconductor layer formed on an insulating substrate;
   a source electrode and a drain electrodes directly contacting a first end portion and a second end portion of the semiconductor layer, respectively;
   a pixel electrode having an opening portion formed thereon;

a first insulating layer formed over the remaining portion of the insulating substrate except for the opening portion;

a gate electrode formed on a portion of the first insulating layer formed over the semiconductor layer; and a source region and a drain region formed in the first end portion and the second end portion of the semiconductor layer.

2. The device of claim 1, wherein the source electrode and the drain electrode include a pixel electrode material layer, a metal material layer, and a capping insulating material layer, each stacked sequentially.

3. The device of claim 2, wherein the pixel electrode extends from either of the source electrode and the drain electrode.

4. The device of claim 2, further comprising a storage capacitor including a first capacitor electrode and a second capacitor electrode with a dielectric layer interposed therebetween, the first capacitor electrode including the pixel electrode material layer and the metal material layer, each stacked sequentially, the second capacitor electrode including a gate electrode material layer, the dielectric layer including the capping insulating material layer and the first insulating layer, each stacked sequentially.

5. The device of claim 1, wherein the source region and the drain regions include at least one offset region formed in a portion of the semiconductor layer between the source electrode and the drain electrode and the gate electrode.

6. The device of claim 1, wherein the source and drain regions include a low-density source region and a low-density drain region formed in a portion of the semiconductor layer between the source electrode and the drain electrodes and the gate electrode, thereby forming a lightly doped drain structure.

7. The device of claim 1, further comprising, a first spacer and a second spacer, the first spacer formed on side wall portions of the source electrode and the drain electrode, the second spacer formed on side wall portions of the gate electrode and the opening portion.

8. The device of claim 1, further comprising, a second insulating layer for planarization on the remaining portion of the first insulating layer except for the opening portion.

9. The device of claim 1, wherein the gate electrode includes a metal material layer and a capping insulating layer, each stacked sequentially.

* * * * *